United States Patent
Spinali

(10) Patent No.: US 6,574,053 B1
(45) Date of Patent: Jun. 3, 2003

(54) KINEMATIC ALIGNMENT STRUCTURE FOR PLACEMENT BETWEEN COMPONENTS AXIALLY ALIGNED IN A CYLINDRICAL BODY

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,062

(22) Filed: Aug. 10, 2000

(51) Int. Cl.7 .................................................. G02B 7/02
(52) U.S. Cl. ...................................................... 359/819
(58) Field of Search ................................ 359/819, 822, 359/821

(56) References Cited

U.S. PATENT DOCUMENTS

| | | | |
|---|---|---|---|
| 4,696,692 A | 9/1987 | Schmitt | 65/102 |
| 4,733,945 A | 3/1988 | Bacich | 359/820 |
| 4,929,054 A | 5/1990 | Ahmad et al. | 359/820 |
| 5,249,082 A | 9/1993 | Newman | 359/813 |
| 5,313,333 A * | 5/1994 | O'Brine et al. | 359/820 |
| 5,357,300 A | 10/1994 | Yanagi et al. | 396/529 |
| 5,428,482 A | 6/1995 | Bruning et al. | 359/827 |
| 5,488,514 A | 1/1996 | Bruning et al. | 359/811 |
| 5,576,895 A | 11/1996 | Ikeda | 359/811 |
| 5,638,223 A | 6/1997 | Ikeda | 359/827 |
| 5,973,863 A | 10/1999 | Hatasawa et al. | 359/823 |
| 5,986,827 A | 11/1999 | Hale | 359/822 |
| 6,122,114 A * | 9/2000 | Sudo et al. | 359/819 |
| 6,191,898 B1 | 2/2001 | Trunz et al. | 359/819 |
| 6,259,571 B1 | 7/2001 | Holderer et al. | 359/819 |
| 6,388,823 B1 | 5/2002 | Gaber et al. | 359/819 |

* cited by examiner

*Primary Examiner*—Ricky Mack
(74) *Attorney, Agent, or Firm*—Finnegan, Henderson, Farabow, Garrett & Dunner, L.L.P.

(57) ABSTRACT

A kinematic alignment structure is provided for use as an attachment to a cylindrical body. The cylindrical body carries a plurality of axially aligned components, such as an optical lens barrel carrying a plurality of lens holders. The alignment structure includes a spacer ring having three support protrusions on each of the ring's two opposing surfaces. The spacer ring is rotatable around the axial direction of the lens barrel to position the support protrusions to control the axial alignment of the lens holders. The kinematic alignment structure also include a lens holder having a set of flexures around the outer circumference of the lens holder. The flexures are equi-angularly positioned on the outer circumference to adjust the lens holder in a radial direction and to facilitate assembling of the lens barrel.

24 Claims, 8 Drawing Sheets

KINEMATIC ALIGNMENT STRUCTURE FOR PLACEMENT BETWEEN COMPONENTS AXIALLY ALIGNED IN A CYLINDRICAL BODY

BACKGROUND OF THE INVENTION

1. Field of the Invention

This invention relates to an alignment structure for an optical assembly. The optical assembly may be attached to an exposure apparatus in a photolithography process to manufacture semiconductor wafers. More particularly, the present invention relates to a kinematic spacer and a set of flexures which can be placed between two adjacent lens cells in the optical assembly to control axial and radial alignments of the lens cells along an optical axis of the optical assembly.

2. Description of the Related Art

A lens barrel is a tubular mechanical structure containing a series of lenses which are aligned to transfer an image from one end of the lens barrel to the other. The lens barrel may include a sturdy threaded body and durable metal retaining rings, often referred to as sub-barrels, to carry a series of lens holders, commonly referred to as cells.

Two conventional optical barrel structures are currently available in the market. A first type of conventional lens barrel carries a plurality of lens holders on which lenses are mounted. The lens holders are stacked in a serial orientation along an optical, axis of the lens barrel and slidably fit inside the lens barrel. This structure is commonly referred to as the barrel type. A second type of lens barrel comprises a series of sub-barrels connected end to end by fasteners. This structure is referred to as the sub-barrel type. In both types of conventional optical barrels, the barrel and the sub-barrels are commonly made of brass because brass is relatively inexpensive and easy to machine to achieve components with high tolerances.

Both optical barrel types are commonly used in optical assembly. For example, an optical assembly having a lens barrel may be used in an exposure apparatus for production of semiconductor wafers. The exposure apparatus includes a reticle positioned near an entrance end of the lens barrel and a semiconductor wafer positioned near an exit end. The reticle defines a pattern of signal paths to be etched on a semiconductor wafer. The exposure apparatus shines light through the reticle, and transfers the pattern through the lens barrel onto a predetermined area on the semiconductor wafer. The semiconductor wafer is a silicon wafer with a photo-sensitive coating for making semiconductor devices, such as microprocessor or memory chips.

Commonly, an optical lens barrel, either the barrel type or the sub-barrel type, includes a plurality of lens cells carrying a plurality of lenses having various characteristics. The lens cells are serially aligned along the optical axis of the lens barrel. A washer is often used between adjacent lens cells to space the cells apart from each other. The washer is an annular flat ring having two opposing flat surfaces. Each flat surface facilitates full-surface contact with the adjacent lens cell.

A common problem with lens barrels is that lens cells often do not align properly both in the axial and radial direction with respect to the optical axis of the lens barrel. In addition, the lens barrel structure may need to be repeatedly disassembled to replace the lenses. The lens cells often do not align properly when reassembled. Therefore, a primary consideration for this type of optical barrel structure includes designing components for an optical lens barrel which are capable of holding high tolerances and accurate alignment even when the optical barrel structure is repeatedly disassembled and reassembled.

In light of the foregoing, there is a need for an alignment structure for use as an attachment to the lens barrel, as well as an aligning method, to control accurate alignment of the axially aligned components carried in the lens barrel.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, the invention is directed to a kinematic alignment structure. The alignment structure may be used as an attachment inside a cylindrical body which carries a plurality of axially aligned components. An example of such a cylindrical body applying the principles of the present invention includes an optical lens barrel carrying a plurality of lens cells. The alignment structure comprises a spacer ring having two opposing surfaces and a plurality of support protrusions positioned on one of the two opposing surfaces. The spacer ring is rotatable around the axial direction to position the support protrusions to control the axial alignment of the components. Additionally, the alignment structure may further comprise an article holder having a plurality of centering flexures. The plurality of centering flexures are equi-angularly positioned on the outer circumference of the article holder to adjust the article holder in a radial direction.

The present invention is also directed to a method for kinematically aligning a plurality of components which are axially aligned and carried in a cylindrical body. The method comprises the step of providing a spacer ring having two opposing surfaces and a plurality of support protrusions positioned on one of the two opposing surfaces, and rotating the spacer ring around the axial direction to position the support protrusions to control the axial alignment of the components. The method may also include a step of providing an article holder to adjust the article holder in a radial direction. The article holder has an outer circumference and a plurality of centering flexures. The centering flexures are equi-angularly positioned on the outer circumference to control the radial alignment of the article holder within the cylindrical body. The method may also include a step of aligning the plurality of centering flexures with corresponding alignment marks on the inner surface of the cylindrical body to facilitate consistent alignment during an assembly process.

It is to be understood that both the foregoing general description and the following detailed description are exemplary and explanatory only and are not restrictive of the invention as claimed.

Additional advantages will be set forth in the description which follows, and in part will be understood from the description, or may be learned by practice of the invention. The objects and advantages may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE PREFERRED EMBODIMENT

Reference will now be made in detail to an embodiment consistent with the principles of the invention. The accompanying drawings illustrate some examples of the embodiment. Wherever possible, the same reference numbers will be used throughout the drawings to refer to the same or like parts. The invention will be further clarified by the following examples, which are intended to be exemplary of the invention.

This invention applies generally to aligning a plurality of components serially stacked in a cylindrical body. Particularly, the invention is well suited for controlling axial and radial alignments of a lens cell inside an optical assembly.

Figure 1:
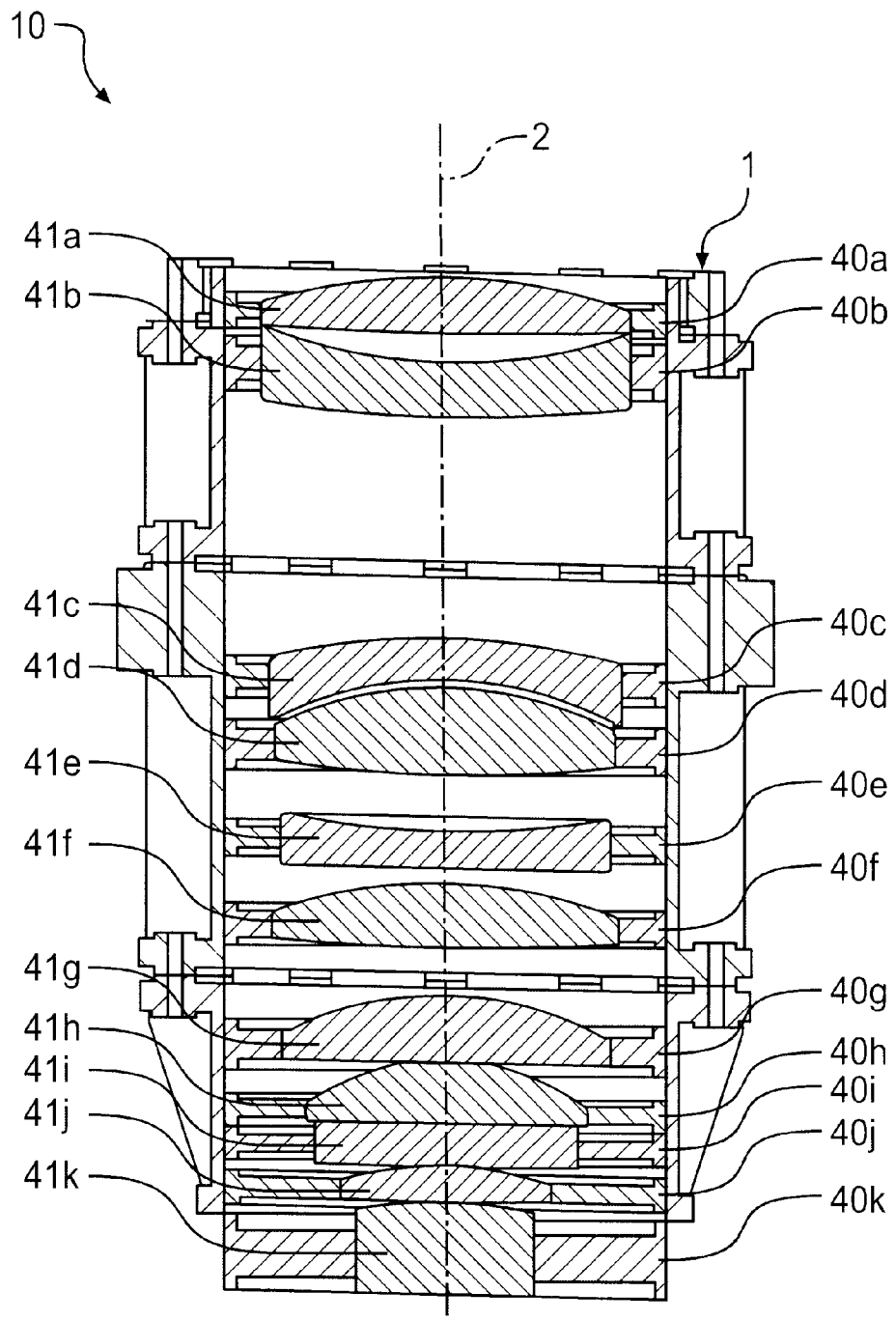
FIG. 1 is a cross-sectional elevation view of an optical assembly.

FIG. 1 shows a cross-sectional elevation view of an optical assembly 10 including an optical lens barrel 1 carrying a plurality of lens cells 40a, 40b, 40c, 40d, 40e, 40f, 40g, 40h, 40i, 40j, and 40k, which are serially aligned along an optical axis 2, holding lenses 41a, 41b, 41c, 41d, 41e, 41f, 41g, 41h, 41i, 41j, and 41k, respectively. A kinematic alignment structure according to this invention comprises a spacer ring to be placed between adjacent lens cells to control axial alignment, i.e., minimizing tilting error, of the serially stacked lens cells. The kinematic alignment structure also comprises a lens cell 40a, 40b, 40c, 40d, 40e, 40f, 40g, 40h, 40i, 40j, or 40k having a plurality of centering flexures to control radial alignment, i.e., minimizing shifting error, of lens cell 40a, 40b, 40c, 40d, 40e, 40f, 40g, 40h, 40i, 40j, or 40k, within lens barrel 1.

Consistent with the principles of the present invention, a kinematic alignment structure is provided. The alignment structure comprises a spacer ring having two opposing surfaces. In one embodiment, the spacer ring has three support protrusions on each of its two opposing surfaces. The spacer ring is rotatable around the axial direction of the cylindrical body to position the support protrusions to control the axial alignment of the components.

Figure 2:
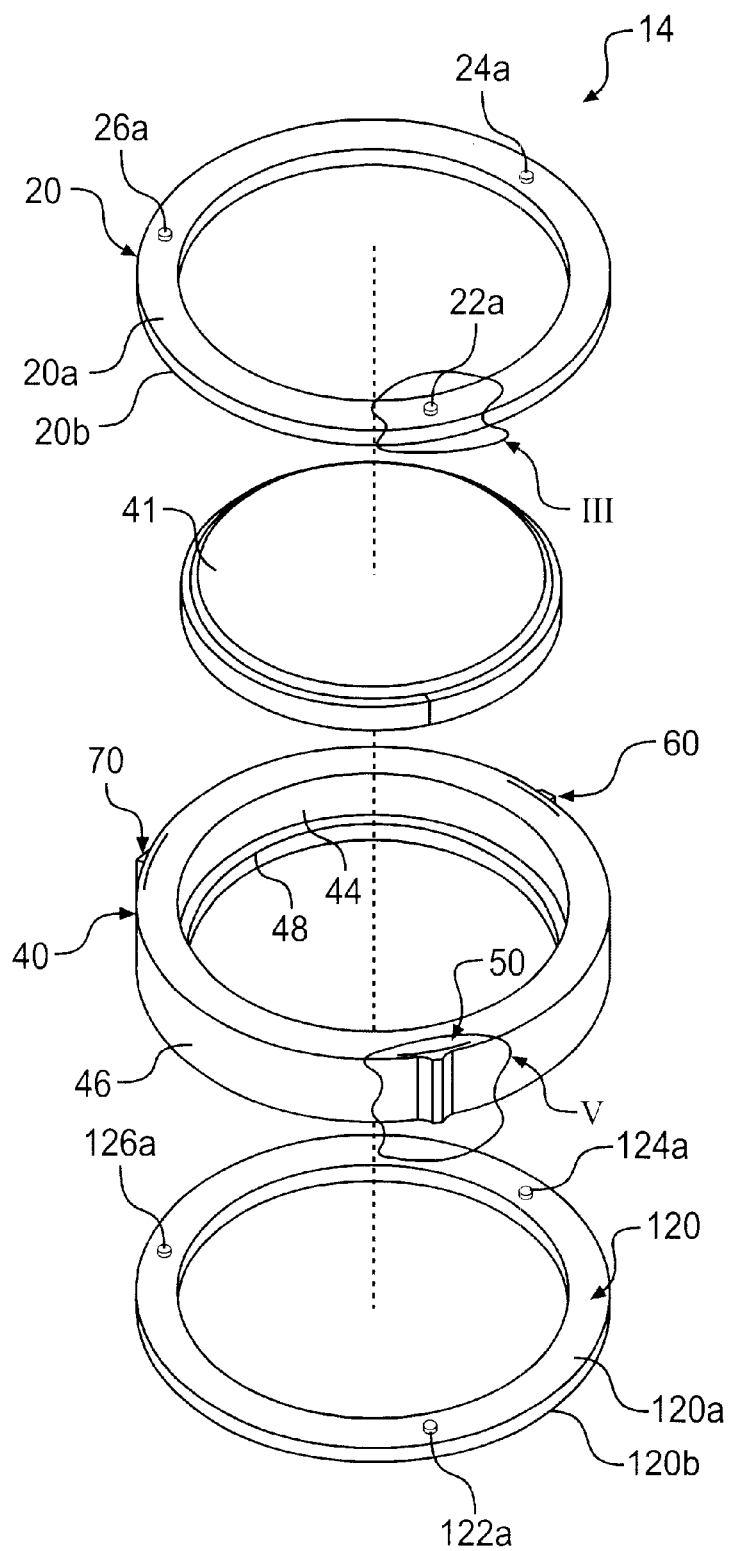
FIG. 2 is a perspective view of a kinematic alignment structure for the optical assembly consistent with the principles of the present invention.

In the embodiment illustrated in FIG. 2, a kinematic alignment structure 14 comprises a spacer ring 20. Spacer ring 20 has an upper surface 20a and a lower surface 20b. Spacer ring 20 further comprises, in one embodiment, a set of three support protrusions 22a, 24a, and 26a on surface 20a, and a corresponding set of three support protrusions (not shown) on surface 20b. Support protrusions 22a, 24a, and 26a are uniformly distributed at substantially 120° from each other on surface 20a. Similarly, the support protrusions on surface 20b are uniformly distributed at substantially 120° from each other on surface 20b. Support protrusion 22a on surface 20a, and the corresponding support protrusion on opposing surface 20b, are substantially aligned. Similarly, support protrusions 24a, 26a on surface 20a, and the corresponding protrusions on surface 20b, are substantially aligned. One lens barrel may include a plurality of spacer rings 20 to control axial alignment of the serially stacked lens cells. As many spacer rings 20 as needed may be provided to control cell-to-cell axial adjustment of the lens barrel. FIG. 2 shows a second spacer ring 120 with an upper surface 120a having three support protrusions 122a, 124a, and 126a, and a lower surface 120b having three similarly aligned support protrusions (not shown).

The support protrusions, in one embodiment, are integrated with spacer ring 20. Spacer ring 20, along with the support protrusions may be made of brass or brass alloy because brass is relatively inexpensive and easy to machine to achieve components with high tolerances. Other similar types of material may also be used. Spacer ring 20, along with the support protrusions are precisely machined to hold a small tolerance, such as, for example, approximately 2 microns.

Figure 3:
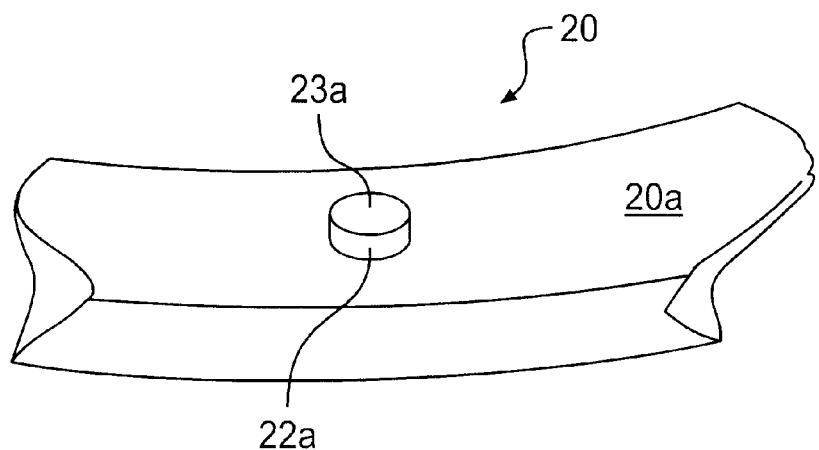
FIG. 3 is an enlarged perspective view of one of the support protrusions taken from portion III of FIG. 2.

FIG. 3 shows an enlarged perspective view of support protrusion 22a on surface 20a taken from portion III of FIG. 2. Support protrusion 22a includes a contact surface 23a. Likewise, support protrusions 24a and 26a have similar contact surfaces (not shown), and the corresponding support protrusions on surface 20b also have contact surfaces (not shown). The contact surfaces may be finely ground, either machined by some kind of an abrasive equipment or manually by a slip stone, to reduce their heights.

Figure 4A:
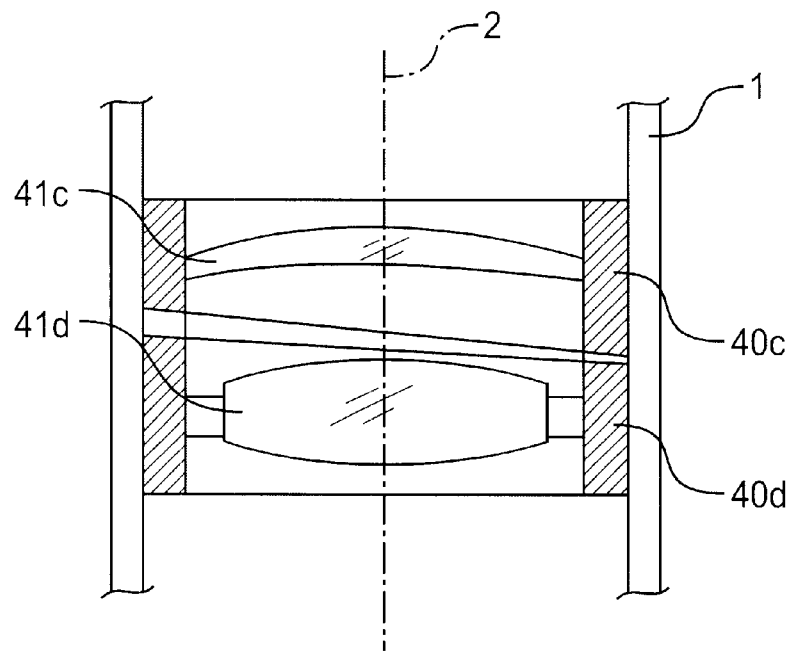
FIG. 4A is a schematic view of adjacent lens cells without a spacer ring.
Figure 4B:
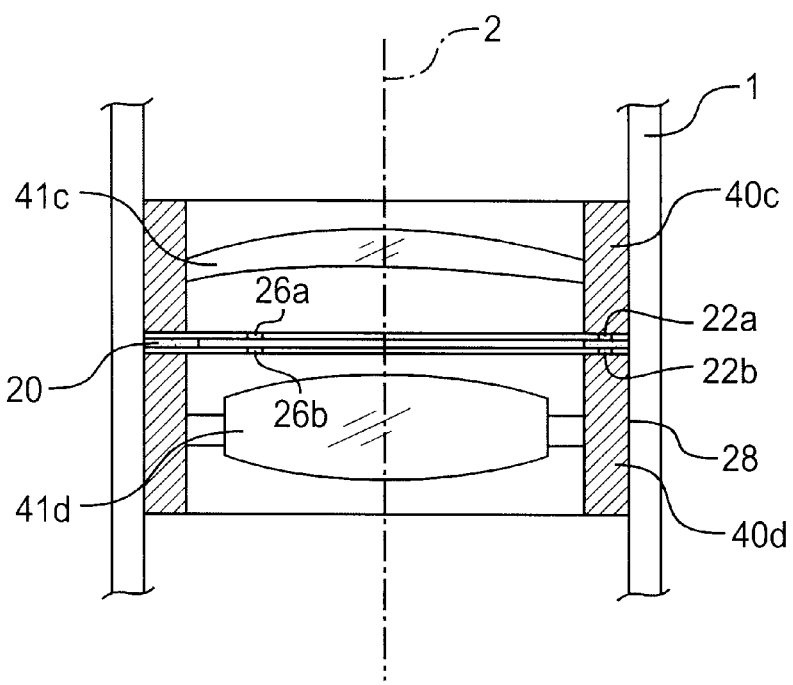
FIG. 4B is a schematic view of adjacent lens cells with a spacer ring consistent with the principles of the present invention.

In operation, spacer ring 20 functions as follows. Between two adjacent lens cells, there may be a misalignment with respect to optical axis 2. For example, there may be a tilting error as schematically shown in exaggeration in FIG. 4A. In reality, this tilting error may be a few microns. Spacer ring 20 is then placed between the two adjacent lens cells 40 to control the axial misalignment and reduce the tilting error. By rotating spacer ring 20 around the optical axis 2, the two opposing sets of support protrusions, will control misalignment in the axial direction. For example, as schematically illustrated in FIG. 4B, positioning support protrusions 22a and 22b at periphery 28 will counter tilt lens cell 40c, thus reducing the tilting error such as depicted in FIG. 4A. If necessary, support protrusions 24a, 26a, 24b, and 26b, may be ground down to reduce the height of support protrusions, and thus, further reducing the tilting error.

Also, consistent with the principles of the invention, the alignment structure may further comprise an article holder having a plurality of centering flexures. The plurality of centering flexures are equi-angularly positioned on the outer circumference of the article holder to adjust the article holder in a radial direction.

In the embodiment illustrated in FIG. 2, a kinematic alignment structure 14 further comprises an article holder, such as a lens cell 40 holding lens 41. Lens cell 40 is an annular body which slidably fits inside a lens barrel structure. Lens cell 40 has an inner circumference 44 and an outer circumference 46. Lens cell 40 comprises a lens seat 48 onto which lens 41 is fastened. Lens 41 may be fastened to lens cell 40 by way of adhesive, a retaining ring, or other fastening means. Lens cell 40 comprises a plurality of flexures. For example in FIG. 2, three flexures 50, 60, and 70 are shown. In one embodiment, flexures 50, 60, and 70 adjust lens cell 40 in a radial direction. Flexures 50, 60, and 70 are equi-angularly positioned at substantially 120° on outer circumference 46 of lens cell 40. Each of flexures 50, 60, and 70 has the same construction and characteristics.

Figure 5:
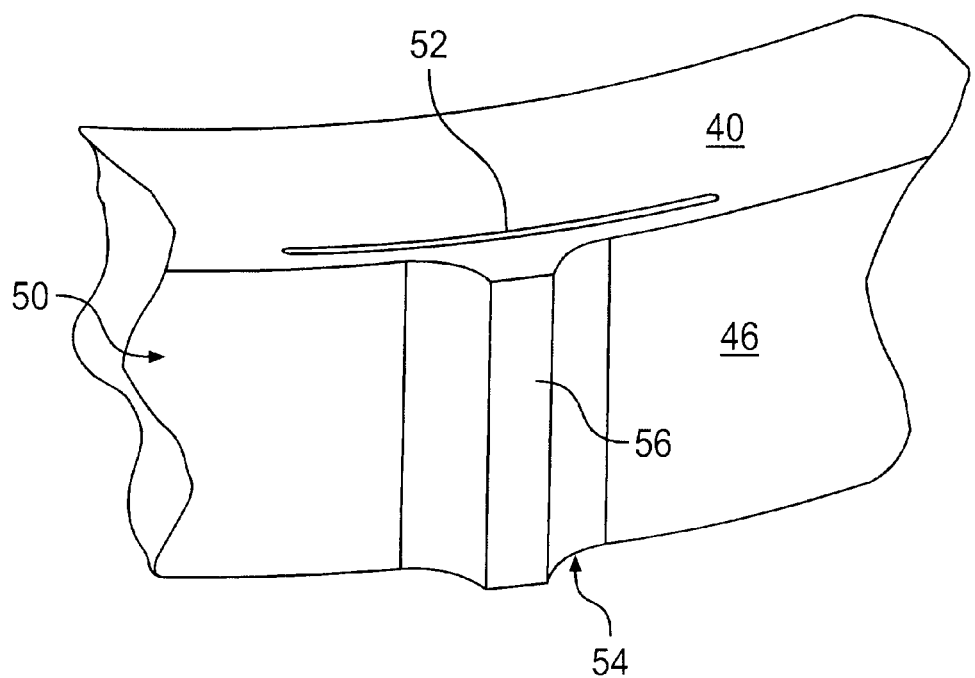
FIG. 5 is an enlarged perspective view of one of the flexures taken from portion V of FIG. 2.

FIG. 5 illustrates flexure 50. Flexure 50 comprises an arcuate slot 52, an alignment projection 54, and an alignment ridge 56. Similarly, flexures 60 and 70 each respectively comprises an arcuate slot, an alignment projection, and an alignment ridge. The arcuate slots cut through lens cell 40, and are parallel and near outer circumference 46. The alignment projections protrude from an annular portion of outer circumference 46, and in one embodiment, are positioned along the mid-segments of the corresponding arcuate slots. Each alignment projection includes a respective alignment ridge on the outermost plane. Inner surface of lens barrel 1 preferably comprises corresponding alignment slots (not shown) to receive the alignment projections and the alignment ridges. The alignment projections and alignment ridges are, in one embodiment, made of the same material as lens cell 40, and are preferably machined as integral portions of lens cell 40.

Figure 6:
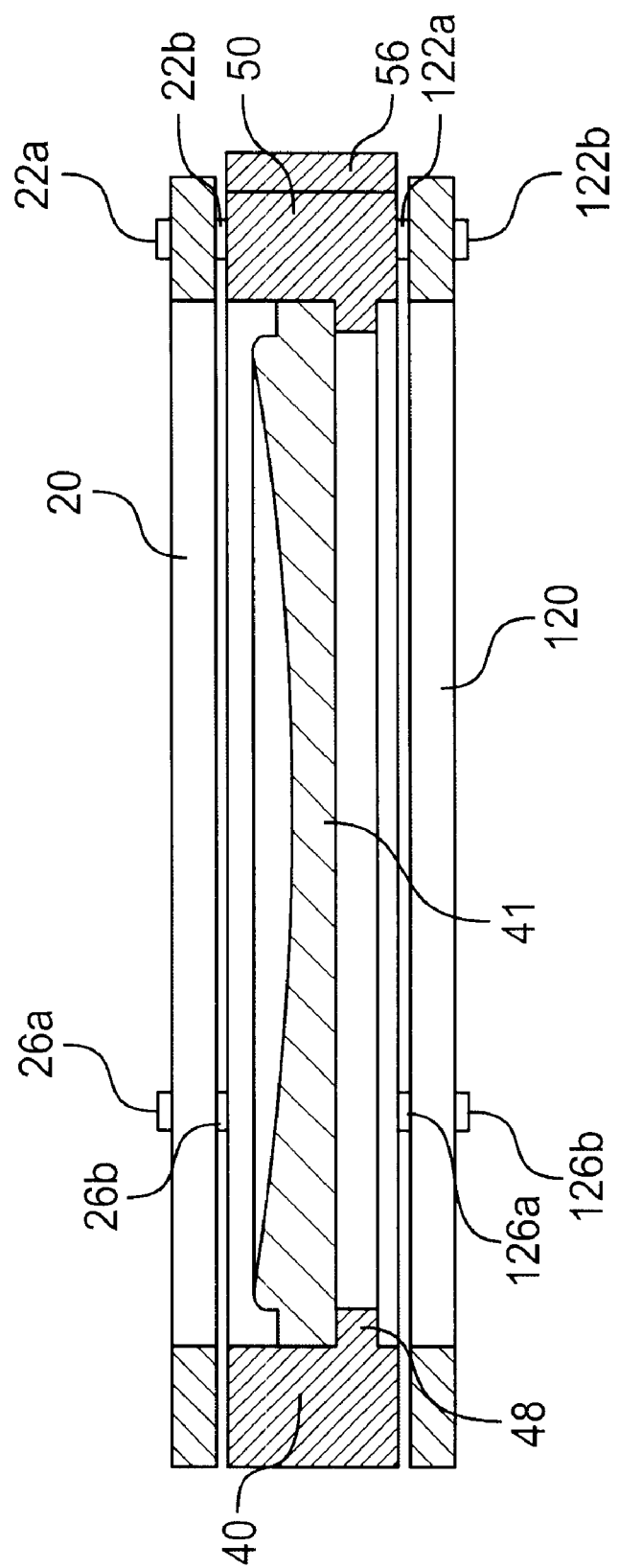
FIG. 6 is a cross-sectional elevation view of the kinematic alignment structure.

In operation, lens cell 40 and flexures 50, 60, and 70, work as follows. FIG. 6 shows a cross-sectional elevation view of an assembled kinematic alignment structure of FIG. 2. Optical lens barrel 1 often needs to be disassembled and reassembled. For example, optical lens barrel 1 may need to be disassembled to insert or adjust spacer rings 20 to control axial misalignment of the lens cells 40, to replace lens cells 40 with different ones to change characteristics of lenses 41 held by the cells 40, or any other reasons. Flexures 50, 60, and 70, help centering lens cell 40 in a radial direction, normal to the optical axis 2, within optical lens barrel 1. The arcuate slots and projections act like a set of springs. The mathematical relation of spring constant, spring force, and the distance of spring compression or elongation can be expressed as:

$$F = k \cdot x$$

wherein F is the force exerted by or stored in the spring, k is the elasticity property of the spring, and x is the distance by how much the spring is compressed or elongated. Since flexures 50, 60, and 70 have the same structure and are made of the same material, the same spring constant value applies for all flexures 50, 60, and 70. Absent external forces, the same amount of spring force will be exerted by lens cell 40, via flexures 50, 60, and 70, on the inner wall of lens barrel 1. Therefore, flexures 50, 60, and 70 will be compressed or elongated (more likely compressed in this case) by the same distance, and thus, radially centering the position of lens cell 40 within the lens barrel 1.

In addition, when lens barrel 1 is reassembled, flexures 50, 60, and 70 facilitate consistent alignment during the reassembling process. To achieve this, alignment projection 54 and the other two corresponding alignment projections, along with alignment ridge 56 and the other two corresponding alignment ridges, align with a corresponding set of three grooves (not shown) provided on the inner wall of lens barrel 1. The three grooves on lens barrel 1 also include some sort of alignment marks to correspond with the alignment ridges. Therefore, when disassembling lens barrel 1 to insert spacer rings 20 to adjust axial alignment of lens cells 40, the time required for reassembling lens barrel 1 will be greatly reduced because the alignment ridges guide the positioning of lens cells 40.

Figure 7:
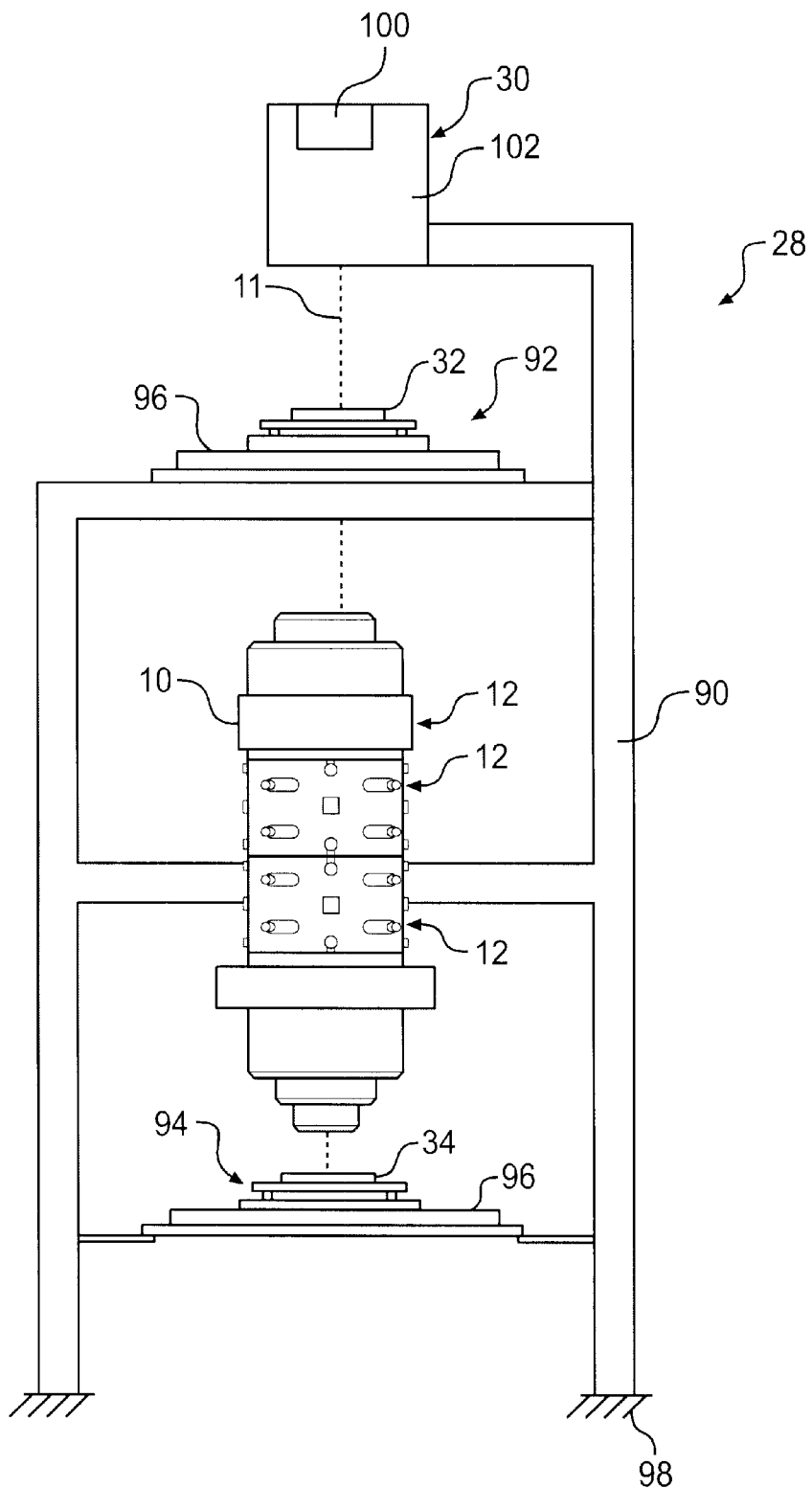
FIG. 7 is an elevation view of an exposure apparatus having features of the present invention.

FIG. 7 is a schematic view illustrating an exposure apparatus 28 useful with the present invention. Exposure apparatus 28 includes apparatus frame 90, illumination system 30, reticle stage 92, optical assembly 10 with optical sections 12, wafer stage 94, and one or more of motors 96 to move and position one or both of the stages 92 and 94.

Exposure apparatus 28 is particularly useful as a photolithographic device which transfers a pattern (not shown) of an integrated circuit from reticle 32 onto semiconductor wafer 34. Exposure apparatus 28 is designed to be mounted to base 98, i.e., a floor or the ground or some other supporting structure.

Apparatus frame 90 is rigid and supports the components of exposure apparatus 28. The design of apparatus frame 90 may vary to suit the design requirements for the rest of exposure apparatus 28. Apparatus frame 90 supports reticle stage 92, wafer stage 94, optical assembly 10, and illumination system 30 above base 98. Alternatively, for example, separate, individual structures (not shown) can be used to support wafer stage 94, reticle stage 92, illumination system 30, and optical assembly 10 above base 98.

Illumination system 30 (irradiation apparatus) includes an illumination source 100 and an illumination optical assembly 102. Illumination source 100 emits the beam 11 (irradiation) of light energy that illuminates reticle 32. Illumination optical assembly 102 guides beam 11 of light energy from illumination source 100 to optical assembly 10. Beam 11 illuminates selectively different portions of reticle 32 and exposes wafer 34. In FIG. 7, illumination system 30 is illustrated as being supported above reticle stage 92. Typically, however, illumination source 100 is secured to one of the sides of apparatus frame 90 and the energy beam from illumination source 100 is directed to above reticle stage 92 with illumination optical assembly 102.

In this embodiment, optical assembly 10 projects the images of the illuminated portion of reticle 32 onto semiconductor wafer 34. Further, optical assembly 10 is positioned between reticle stage 92 and wafer stage 94.

Reticle stage 92 holds and precisely positions reticle 32 relative to optical assembly 10 and semiconductor wafer 34. Somewhat similarly, wafer stage 94 holds and positions semiconductor wafer 34 with respect to the projected image of the illuminated portions of reticle 32. In the embodiment illustrated in FIG. 7, wafer stage 94 and reticle stage 92 are positioned by separate planar motors 96. The planar motor drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage. Depending upon the design, exposure apparatus 28 can also include additional servo drive units and/or linear motors to move stages 92, 94.

There are a number of different types of exposure apparatus 28. For example, exposure apparatus 28 can be used as a scanning type photolithography system which exposes the pattern from reticle 32 onto wafer 34 with reticle 32 and wafer 34 moving synchronously. In a scanning type lithographic device, reticle 32 is moved perpendicular to an optical axis of optical assembly 10 by reticle stage 92, and wafer 34 is moved perpendicular to an optical axis of optical assembly 10 by wafer stage 94. Scanning of reticle 32 and wafer 34 occurs while reticle 32 and wafer 34 are moving synchronously.

Alternately, exposure apparatus 28 can be a step-and-repeat type photolithography system that exposes reticle 32 while reticle 32 and wafer 34 are stationary. In the step and repeat process, wafer 34 is in a constant position relative to reticle 32 and optical assembly 10 during the exposure of an individual field. Subsequently, between consecutive exposure steps, wafer 34 is consecutively moved by wafer stage 94 perpendicular to the optical axis of optical assembly 10 so that the next field of semiconductor wafer 34 is brought into position relative to optical assembly 10 and reticle 32 for exposure. Following this process, the images on reticle 32 are sequentially exposed onto the fields of wafer 34 so that the next field of semiconductor wafer 34 is brought into position relative to optical assembly 10 and reticle 32.

However, the use of exposure apparatus 28 provided herein is not limited to a photolithography system for a semiconductor manufacturing. Exposure apparatus 28, for example, can be used as an LCD photolithography system that exposes a liquid crystal display device pattern onto a rectangular glass plate or a photolithography system for manufacturing a thin film magnetic head.

The illumination source 100 can be g-line (436 nm), i-line (365 nm), KrF excimer laser (248 nm), ArF excimer laser (193 nm) and $F_2$ laser (157 nm). Alternatively, illumination source 100 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to optical assembly 10, when far ultra-violet rays such as the excimer laser is used, glass materials such as quartz and fluorite that transmit far ultra violet rays is preferably used. When the $F_2$ type laser or x-ray is used, optical assembly 10 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published in Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published in Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 8:
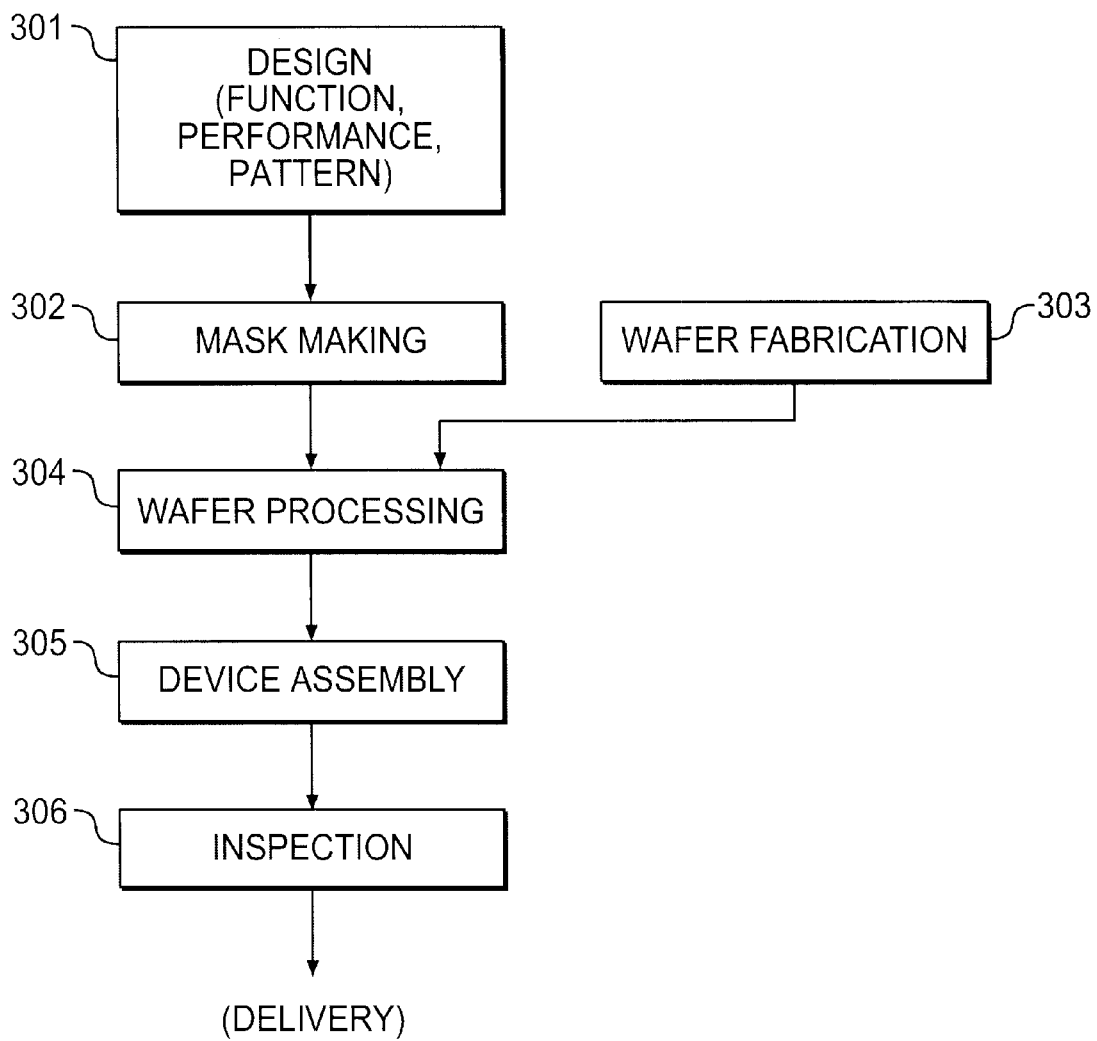
FIG. 8 is a flow chart outlining a process for manufacturing a semiconductor device consistent with the principles of the present invention.

Further, semiconductor devices can be fabricated using the above described systems, by the process shown generally in FIG. 8. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 306 the semiconductor device is assembled (including the dicing process, bonding process and packaging process), then finally the device is inspected in step 306.

Figure 9:
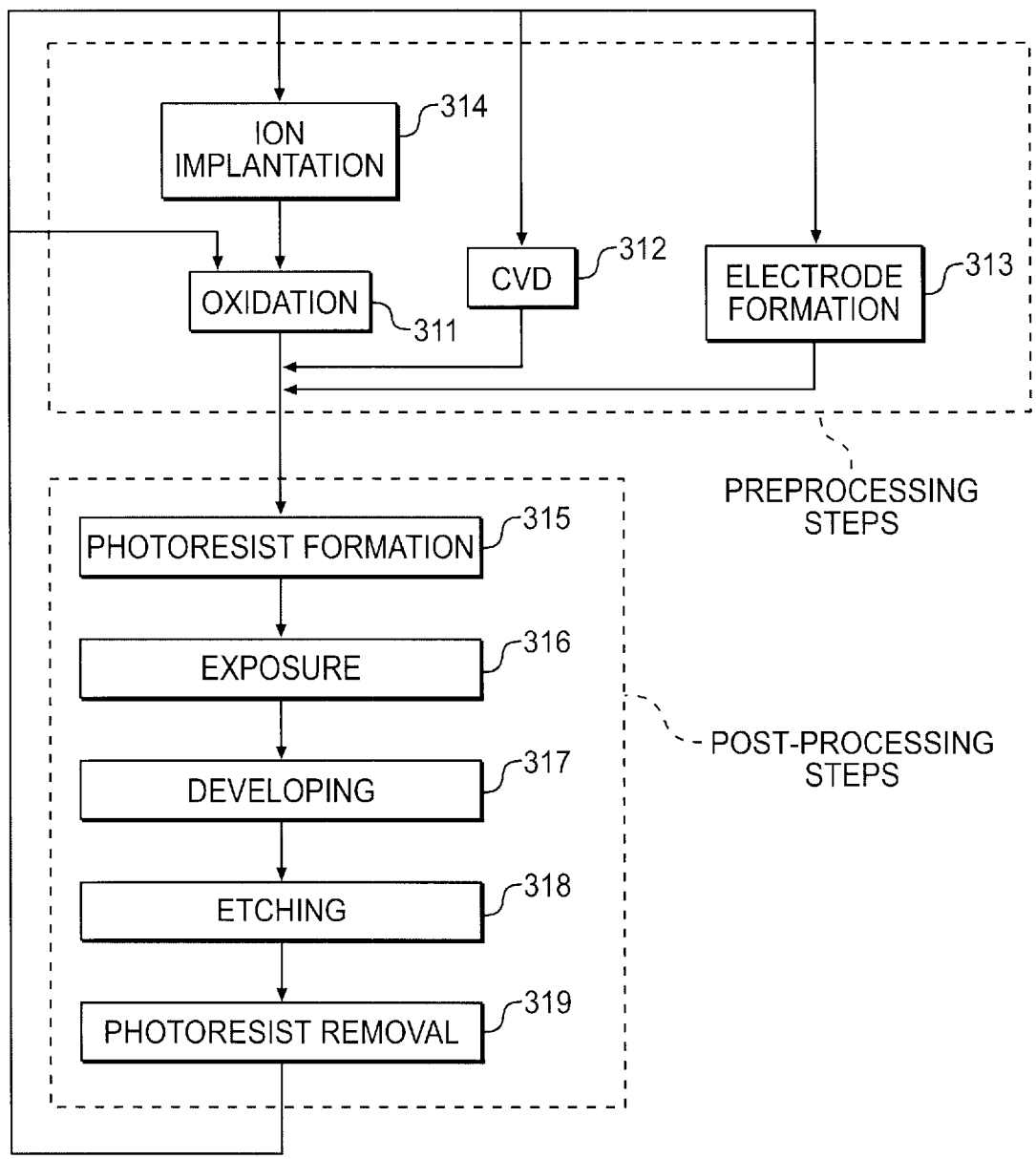
FIG. 9 is a flow chart outlining the process of FIG. 8 in more detail.

FIG. 9 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in construction of the spacer rings and the flexures, the optical lens barrel, including its components, as well as the material chosen for the present invention, and other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. An alignment structure for use with a cylindrical body carrying a plurality of axially aligned components, comprising:

a spacer ring having two opposing surfaces;

a plurality of support protrusions positioned on at least one of the two opposing surfaces;

an article holder configured to contact the spacer ring, the article holder having an outer circumference; and a plurality of flexures positioned on the outer circumference to control alignment of the article holder in a radial direction.

2. The alignment structure of claim 1, wherein the spacer ring is rotatable around the axial direction to position the support protrusions to control the axial alignment of the components.

3. The alignment structure of claim 1, further comprising:

a plurality of support protrusions positioned on the other one of the two opposing surfaces.

4. The alignment structure of claim 1, wherein the plurality of flexures are equi-angularly positioned on the outer circumference.

5. The alignment structure of claim 1, wherein each of the plurality of flexures comprises:

an arcuate slot near the outer circumference of the article holder; and an alignment projection positioned on the outer circumference and corresponding to the arcuate slot.

6. The alignment structure of claim 5, wherein each of the alignment projections comprises:

an alignment ridge corresponding to an alignment mark on an inner surface of the cylindrical body.

7. The alignment structure of claim 1, wherein the plurality of support protrusions are equi-angularly positioned on the surface of the spacer ring.

8. An alignment structure for use with a cylindrical body carrying a plurality of axially aligned components, comprising:

an article holder having an outer circumference; and a plurality of flexures equi-angularly positioned on the outer circumference to control alignment of the article holder in a radial direction.

9. The alignment structure of claim 8, wherein each of the plurality of flexures comprises:

an arcuate slot near the outer circumference of the article holder; and an alignment projection positioned on the outer circumference and corresponding to the arcuate slot.

10. The alignment structure of claim 9, wherein each of the alignment projections comprises:

an alignment ridge corresponding to an alignment mark on an inner surface of the cylindrical body.

11. A method for aligning a plurality of components axially aligned and carried in a cylindrical body, comprising:

providing a spacer ring having two opposing surfaces and a plurality of support protrusions positioned on at least one of the two opposing surfaces;

rotating the spacer ring around an axial direction of the spacer ring to position the support protrusions to control the axial alignment of the components; and providing an article holder configured to contact the spacer ring, the article holder having an outer circumference and a plurality of flexures positioned on the outer circumference.

12. The method of claim 11, further comprising:

aligning the plurality of flexures with corresponding alignment marks on the inner surface of the cylindrical body to adjust the article holder in a radial direction.

13. A method for aligning a plurality of components axially aligned and carried in a cylindrical body, comprising:

providing an article holder having an outer circumference and a plurality of flexures equi-angularly positioned on the outer circumference; and aligning the plurality of flexures with corresponding alignment marks on the inner surface of the cylindrical body to adjust the article holder in a radial direction.

14. A projection lens system, comprising:

a lens barrel having an optical axis, wherein the lens barrel comprises a plurality of alignment marks along an inner surface of the lens barrel parallel to the optical axis;

a plurality of lens holders slidably fit inside the lens barrel;

at least one spacer ring aligned with the optical axis and positioned between two adjacent lens holders, each spacer ring having two opposing surfaces; and a plurality of support protrusions positioned on one of the two opposing surfaces.

15. The projection lens system of claim 14, wherein the spacer ring is rotatable around the axial direction to position the support protrusions to control the axial alignment of the plurality of lens holders.

16. The projection lens system of claim 14, further comprising:

a plurality of support protrusions positioned on the other one of the two opposing surfaces.

17. An exposure apparatus including the projection lens system of claim 14 positioned between an illumination source and a substrate.

18. The projection lens system of claim 14, wherein each of the plurality lens holders has an outer circumference and comprises a plurality of flexures equi-angularly positioned on the outer circumference to control alignment of the lens holder in a radial direction, the number and position of the plurality of flexures corresponding with the number and position of the alignment marks on the inner surface of the lens barrel.

19. The projection lens system of claim 18, wherein each of the plurality of flexures comprises:

an arcuate slot near the outer circumference of the lens holder; and an alignment projection positioned on the outer circumference and corresponding to the arcuate slot.

20. The projection lens system of claim 19, wherein each of the alignment projections comprises:

an alignment ridge corresponding with one of the plurality of alignment marks on the inner surface of the lens barrel.

21. A projection lens system, comprising:

a lens barrel having an optical axis;

at least one lens holder slidably fit inside the lens barrel and having an outer circumference; and a plurality of flexures equi-angularly positioned on the outer circumference of the lens holder to control alignment of the lens holder in a radial direction.

22. The projection lens system of claim 21, wherein each of the plurality of flexures comprises:

an arcuate slot near the outer circumference of the lens holder; and an alignment projection positioned on the outer circumference and corresponding to the arcuate slot.

23. The projection lens system of claim 22, wherein the lens barrel comprises a plurality of alignment marks along an inner surface of the lens barrel parallel to the optical axis, and wherein each of the alignment projections comprises:

an alignment ridge corresponding with one of the plurality of alignment marks on the inner surface of the lens barrel.

24. An exposure apparatus including the projection lens system of claim 21 positioned between an illumination source and a substrate.

* * * * *

UNITED STATES PATENT AND TRADEMARK OFFICE
CERTIFICATE OF CORRECTION

PATENT NO.    : 6,574,053 B1
DATED         : June 3, 2003
INVENTOR(S)   : Marc Spinali It is certified that error appears in the above-identified patent and that said Letters Patent is hereby corrected as shown below:

Column 11,
Line 2, "plurality lens" should read -- plurality of lens --.

Signed and Sealed this

Twenty-second Day of July, 2003

JAMES E. ROGAN
*Director of the United States Patent and Trademark Office*